United States Patent [19]

Velo

[11] 4,380,739
[45] Apr. 19, 1983

[54] ELECTRONIC DIFFERENTIAL CONTROLLER

[75] Inventor: Henri J. Velo, Hilversum, Netherlands

[73] Assignee: U.S. Philips Corporation, New York, N.Y.

[21] Appl. No.: 198,097

[22] Filed: Oct. 17, 1980

[30] Foreign Application Priority Data

Nov. 19, 1979 [NL] Netherlands ............... 7908411

[51] Int. Cl.³ .................. H03F 3/45; H03G 3/30
[52] U.S. Cl. .................... 330/254; 330/257; 330/260
[58] Field of Search .......... 330/252, 254, 257, 260

[56] References Cited

U.S. PATENT DOCUMENTS 4,296,383 10/1981 Jeanout et al. ............... 330/260 X

*Primary Examiner*—James B. Mullins
*Attorney, Agent, or Firm*—Robert T. Mayer; Bernard Franzblau

[57] ABSTRACT

The invention relates to a differential controller comprising two transistors connected as a long-tailed pair with the base circuits of the transistors including resistors whose values are equal to the bulk resistances of the two transistors. The collector circuits of the two transistors include means for injecting currents into said resistors, which currents are proportional to the collector currents of the two transistors.

11 Claims, 2 Drawing Figures

ELECTRONIC DIFFERENTIAL CONTROLLER

The invention relates to an electronic differential controller, which comprises at least a first and a second transistor, having their emitters connected to a point of constant potential via a current source. Such controllers are for example used in so-called control amplifiers for the automatic compensation of telephone cable attenuation. Another field of application is for example in automatic or non-automatic gain controls in radio receivers and in gain and tone controls of low-frequency amplifiers.

A controller of this type is for example known from the IEEE Journal of Solid State circuits, Vol. SC-9, No. 4, August 1974, page 160, FIG. 2. In this known controller the base of a first transistor is connected to the signal source, whereas the base of the second transistor is connected to a point of constant potential. The collector of the first transistor is connected directly to another point of constant potential and the collector of the second transistor is connected to this point via a load resistor.

Simple calculations for the known circuit demonstrate that the presence of the so-called bulk resistances of the first and the second transistor give rise to mainly second-order distortion of the signal to be processed. These bulk resistances appear in the base circuit and the emitter circuit of the two transistors. The sum of the two resistances may be considered to be concentrated in the emitter circuit of the two transistors, in accordance with:

$$R = R_{EE}' + R_{bb}'/(1+B) \quad (1)$$

in which $R_{EE}'$ is the emitter bulk resistance, $R_{bb}'$ the base bulk resistance, and B the collector-base current gain factor of the two transistors. This resistance is not constant, but depends on the B and the current through the two transistors.

In the reference cited the second harmonic distortion is reduced by a balanced version of the said controller. However, this means that twice the number of components is required, as is apparent from the Figure of the said reference.

Another drawback is that owing to the balanced design the signal should be applied to the circuit in balanced form and can only be taken off in balanced form. Generally, the signals to be controlled are unbalanced. A conversion from unbalanced to balanced or vice versa demands an additional input and output transformer or its electronic equivalent.

It is an object of the invention to provide a solution to the aforementioned problem. The invention is characterized in that the base electrodes of the first and the second transistor are each connected to a resistor. The other terminals of said resistors are coupled to each other and the collector circuits of the first and the second transistors include means for injecting currents into said resistors, which currents are proportional to the collector currents flowing through the first and the second transistor.

The invention will be described in more detail with reference to the drawing in which.

Figure 1:
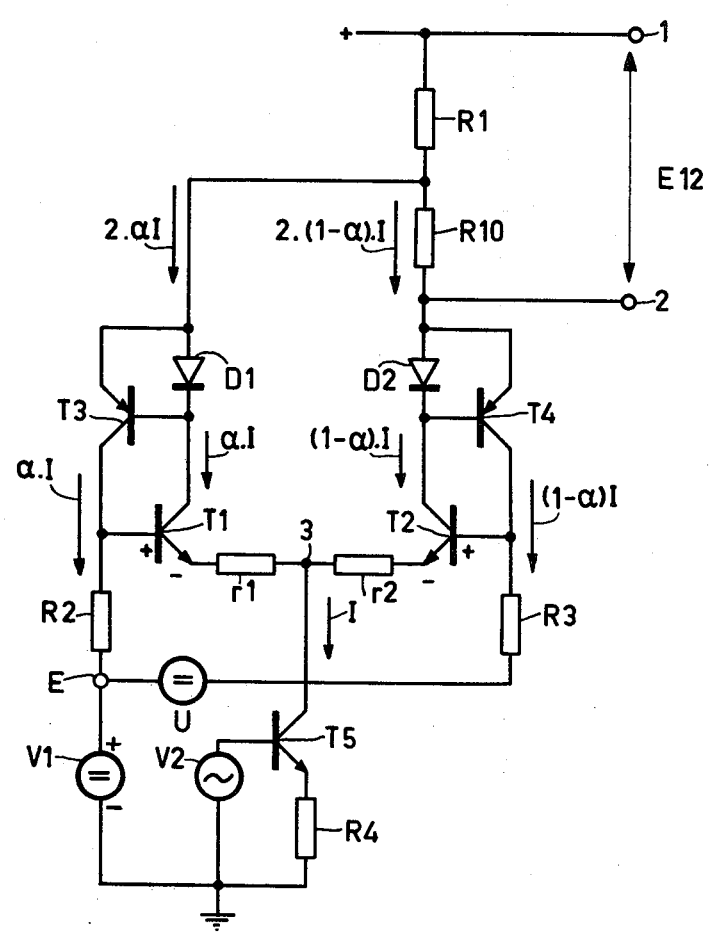
FIG. 1 shows a first embodiment of a differential controller in accordance with the invention.

In FIG. 1 T1 is a first transistor and T2 a second transistor having their emitters connected to a point of constant potential via a controllable current source. This current source is constituted by the transistor T5, the resistor R4 and the voltage source V2. A point E is connected via the resistor R2 to the base of the first transistor T1 and via the resistor R3 and a control current source U to the base of the second transistor T2. Via the direct voltage source V1 point E is connected to a point of constant potential. The means in the collector circuit of the first transistor for injecting current into the resistor R2, which current is proportional to the collector current of the first transistor, are constituted by the diode D1 and the transistor T3. The diode D1 is included in the collector circuit of the first transistor T1, said diode being bridged by the emitter-base path of the auxiliary transistor T3. The collector of the auxiliary transistor T3 is connected to the base of the first transistor T1. The means in the collector circuit of the second transistor T2 for injecting a current into the resistor R3, which current is proportional to the collector current of the second transistor, are constituted by the diode D2 and the transistor T4. The diode D2 is included in the collector circuit of the second transistor T2, which diode is bridged by the emitter-base path of the auxiliary transistor T4.

The collector of the auxiliary transistor T4 is connected to the base of the second transistor T2. The emitter of the auxiliary transistor T4 is connected to a point (1) of constant potential via the resistor R1. The output voltage E12 of the differential controller is available at output terminals 1 and 2.

The various currents flowing in the differential controller of FIG. 1 are represented schematically. The symbol $\alpha$ represents the fraction of the current I flowing out of the DC supply terminal 1 that flows into the collector circuit of transistor T1 and may have a range of values between zero and one. The bulk resistances of the transistors T1 and T2, which satisfy formula (1) are schematically represented by r1 and r2 in FIG. 1. In the control voltage circuit R2, T1, r1, r2, T2, R3 and U, U satisfies the following relation:

$$U = -\alpha.I.R2 + UbE1 + \alpha.I.r1 - (1-\alpha).Ir2 - UbE2 + (1-\alpha).I.R3 \quad (2).$$

If $R2 = r1 = r2 = R3$, then $$U = UbE1 - UbE2 \quad (3)$$

is valid.

It follows from relation (3) that the distortion caused by the bulk resistances r1 and r2 is compensated for.

By means of the direct current source VI, the potential at point E is adjusted so that it exceeds the potential at point 3. The factor $\alpha$ is set by means of the direct voltage source U. The output voltage E12 between points (1) and (2) satisfies the relation $$E12 = 2I.R1 + 2(1-\alpha).I.R10 \quad (4)$$

$$\text{If } R10 = N.R1 \text{ then } E12 = 2I.R1[1 + N.(1-\alpha)] \quad (5)$$

$$\text{If } \alpha = 0, \text{ this yields } E12 \text{ (MAX)} = 2I.R1.(1+N) \quad (6)$$

$$\text{If } \alpha = 1, \text{ this yields } E12 \text{ (MIN)} = 2I.R1 \quad (7)$$

The control range will then be $20 \cdot \log(1+N)$ \quad (8)

Since N is a resistance ratio the control range is accurately defined. The current I which flows through the transistor T5 may be a direct current on which an alternating current is superimposed. The currents flowing in the collectors of the first and the second transistor will then no longer be distorted due to the resistors $r_1$ and $r_2$.

Figure 2:
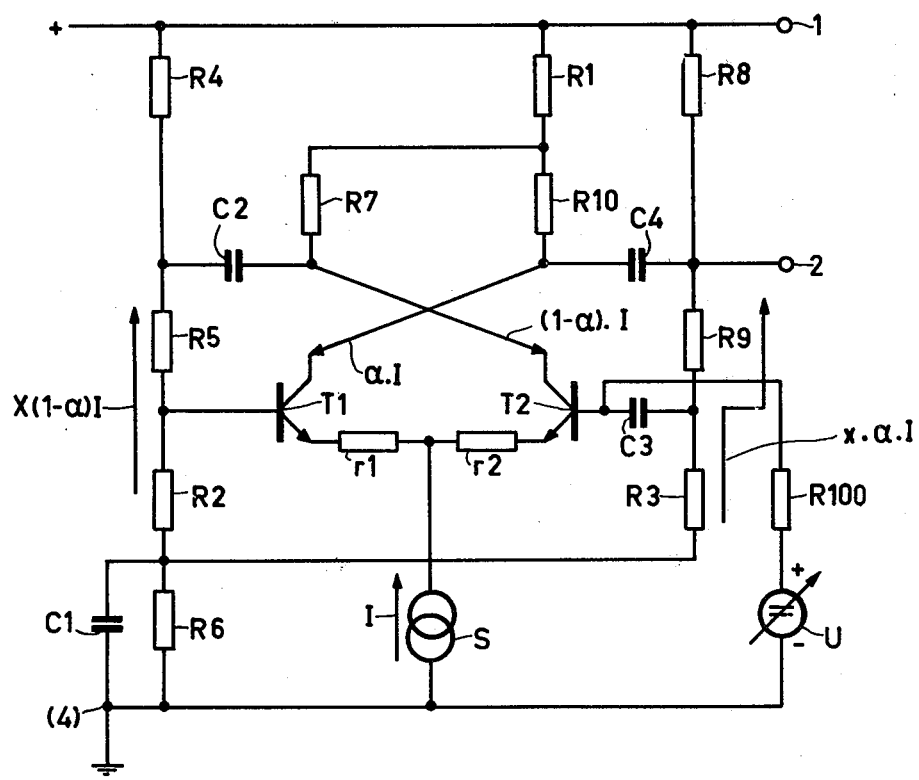
FIG. 2 shows a second embodiment of a differential controller in accordance with the invention.

In the embodiment shown in FIG. 2 T1 and T2 respectively constitute the first and the second transistor. The bulk resistances of the first and the second transistor are designated r1 and r2 respectively. The junction point of these resistances is connected to a point of constant potential (4) via the common current source S. The series connection of the resistors R4, R5, R2 and R6 is included between points 1 and 4. The junction of resistors R2 and R6 is connected to point 1 via the series connection of the resistors R3, R9 and R8. The last-mentioned junction point is also connected to point 4 via the capacitance C1. The junction point of the resistors R2 and R5 is connected to the base electrode of the first transistor T1. The base electrode of the second transistor T2 is connected to the junction point of the resistors R3 and R9 via the capacitance C3. The base electrode of the transistor T2 is also connected to point 4 of constant potential via the series connection of the resistor R100 and the control voltage source U. The junction point of resistors R8 and R9 is connected to the collector of the transistor T1 via the capacitance C4 and also constitutes the output terminal 2 of the differential controller. The junction point of the resistors R4 and R5 is connected to the collector of the transistor T2 via the capacitance C2. The collector of the transistor T2 is also connected to the point (1) of constant potential via the series connection of the resistors R7 and R1. The collector of the transistor T1 is connected to the point (1) of constant potential via the series connection of the resistors R10 and R1.

The difference between the base-emitter voltage of the first and the second transistor is set by means of the control voltage source U. This setting determines the magnitudes of the collector currents of the respective transistors T1 and T2. For the said compensation of distortion as a result of the two bulk resistances r1 and r2, it is necessary that the alternating voltages across these two bulk resistances are compensated for by means of the resistors R2 and R3//R100 (i.e. R3 in parallel with R100). Owing the presence of the capacitance C3 the base of the transistor T2 is a.c. coupled to the junction point of the resistors R3 and R9. Owing to the presence of the capacitance C1 the junction point of the resistors R2 and R6 is a.c. coupled to the point (4) of constant potential. As a result of this series the series connection of the resistor R100 and the control voltage source U is connected across the resistor R3 for alternating current. Thus, for a.c. calculations the resistor R3 is connected in parallel with the resistor R100. For a full compensation of distortion caused by the presence of the two bulk resistances, the following relation should be satisfied: $x(1-\alpha).I.R2+\alpha.I.r1-(1-\alpha).I.r2-x.\alpha.I.R3//R100=0$ . . . (9). If $x.R2=r1=r2=x.R3//R100=R$ this equation is satisfied so that the distortion is compensated for.

What is claimed is:

1. An electronic differential controller comprising first and second transistors coupled together to form a differential amplifier with each transistor having an emitter connected to a point of constant voltage via an input signal current source, means for deriving an output signal from the collector circuit of one of said transistors, means coupling base electrodes of the first and second transistors to a control circuit for adjusting the currents in said transistors, said control circuit comprising first and second resistors having a first terminal connected to the base electrodes of the first and second transistors, respectively, and means for connecting a second terminal of said resistors together, and wherein the collector circuits of the first and second transistors include means for injecting currents into said resistors that are proportional to the collector currents flowing through the first and second transistors.

2. An electronic differential controller as claimed in claim 4 wherein the collector circuits of the first and the second transistor each include at least one semiconductor diode bridged by the base-emitter path of an auxiliary transistor, having a collector connected to the base electrode of the associated first or second transistor.

3. An electronic differential controller as claimed in claim 4 further comprising means connecting the collector of the first transistor to a point of constant potential via the series connection of third and fourth resistors with the junction point of said third and fourth resistors being connected to the collector of the second transistor via a fifth resistor, means connecting the collector of the second transistor to the junction point of sixth and seventh resistors connected in series between the base of the first transistor and the said point of constant potential, and means connecting the collector of the first transistor to the junction point of eighth and ninth series-connected resistors included between said point of constant potential and the base of the second transistor.

4. An electronic differential controller as claimed in claim 1 wherein said current injecting means comprise first and second semiconductor junction devices coupled between the collector electrodes of the first and second transistors and the first terminal of said first and second resistors, respectively.

5. An electronic differential controller as claimed in claim 1 wherein said current injecting means comprise first and second current mirrors each having a first terminal coupled to a point of constant voltage, a second terminal coupled to the collector of a respective one of said first and second transistors, and a third terminal coupled to the base terminal of a respective one of said first and second transistors, said second and third terminals of a current mirror supplying approximately equal currents to the respective collector and the base terminal of the associated transistor.

6. An electronic differential controller as claimed in claims 1, 4 or 5 wherein said control circuit further comprises a source of DC voltage that determines the relative values of the collector currents for said first and second transistors.

7. An electronic differential controller as claimed in claim 1 wherein said output signal deriving means comprise third and fourth resistors connected in series between a collector of one of said transistors and a point of constant voltage, said output signal being developed across said third and fourth resistors.

8. An electronic differential controller as claimed in claim 1 wherein said first and second transistors include first and second bulk resistances r1 and r2, respectively, said first and second resistors having resistance values of R2 and R3, and wherein R2=r1=r2=R3.

9. An electronic differential controller as claimed in claim 1 wherein the collector circuit of the first transistor includes third and fourth resistors connected in series between the collector of the first transistor and a point of DC voltage, the collector circuit of the second transistor includes a fifth resistor connected in series with said fourth resistor between the collector of the second transistor and said point of DC voltage, a first voltage divider including said first resistor connected to said point of DC voltage with a tap point directly connected to the base of the first transistor, a second voltage divider including said second resistor connected to said point of DC voltage with a tap point coupled via a capacitor to the base of the second transistor, and means for capacitively coupling the collectors of the first and second transistors to tap points on said second and first voltage dividers, respectively.

10. An electronic differential controller as claimed in claim 1 wherein said current injecting means include first and second current mirrors for supplying currents to said first and second resistors that vary in the same sense as the collector currents of said first and second transistors, respectively.

11. An electronic differential controller as claimed in claim 1 wherein said current injecting means supply currents to the first terminals of said first and second resistors.

* * * * *